May 23, 1933. S. BALLANTINE Re. 18,835
ELECTRICAL COMMUNICATION CIRCUIT
Original Filed Jan. 9, 1923
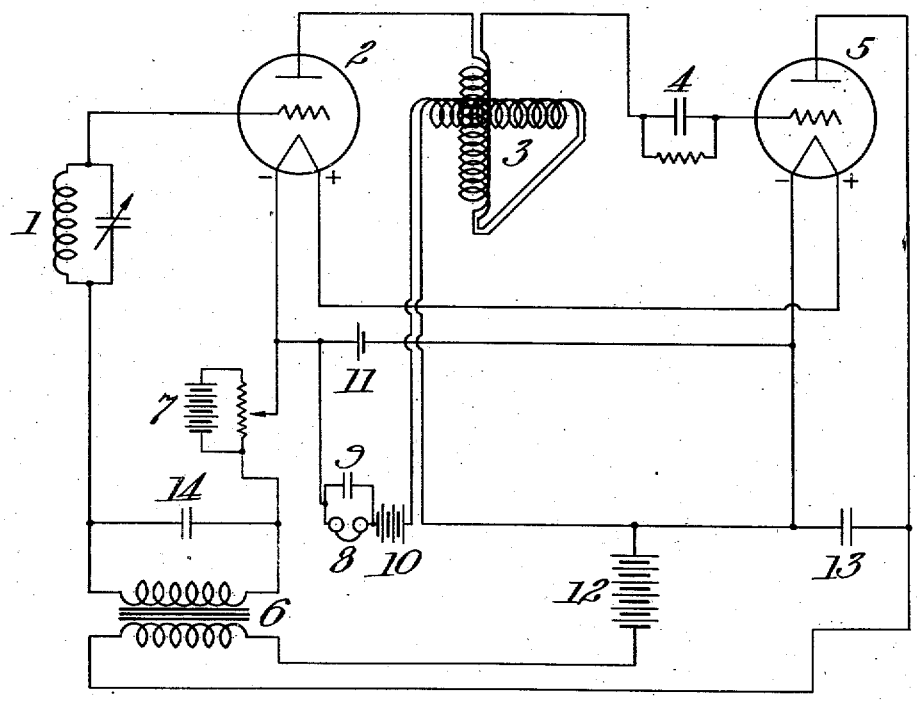
Inventor:
Stuart Ballantine,
By Byrnes Townsend & Potter,
Attorneys.

Reissued May 23, 1933

Re. 18,835

UNITED STATES PATENT OFFICE

STUART BALLANTINE, OF MOUNTAIN LAKES, NEW JERSEY, ASSIGNOR, BY MESNE ASSIGNMENTS, TO RADIO CORPORATION OF AMERICA, OF NEW YORK, N. Y., A CORPORATION OF DELAWARE

ELECTRICAL COMMUNICATION CIRCUIT

Original No. 1,723,719, dated August 6, 1929, Serial No. 611,647, filed January 9, 1923. Application for reissue filed June 13, 1930. Serial No. 461,027.

This invention relates to electrical communication circuits, and particularly to circuits which may include one or more amplifying audion tubes.

It is well known that the audion tubes which are employed in telephone repeating circuits and in radio-telephone transmission and receiving circuits do not give an exact enlarged reproduction of the wave impressed upon the grid of the audion. The distortion arises from the fact that the plate current-grid voltage characteristic of audion tubes is not linear, but is more or less curved throughout its entire extent. When an audion is employed as an amplifier, the distortion produced is comparatively small when the operating point is located on the "linear" part of the aforementioned characteristic curve, but some distortion is always present. When used as a detector, however, the operating point of the audion is on the curved portion of the characteristic, and distortion always results, since the amplitude of the rectified current varies approximately as the square of the amplitude of the impressed voltage.

This invention has for an object the provision of an electrical communication circuit which may include one or more amplifying audions in which the distortion produced by the audion or audions is reduced or eliminated, such reduction or elimination of the distortion being often referred to as neutralizing the distortion. A further object is to provide a circuit of the type stated, in which the amplification ratio of one or more of the audions is varied to produce a correction which will reduce or eliminate the distortion normally present in such circuit. More specifically an object of the invention is to provide a radio receiving circuit including an audion amplifier and a detector, in which the amplifying ratio of the audion is controlled to introduce a correction which will reduce or eliminate the distortion produced by the detector.

The accompanying drawing illustrates an embodiment of my invention as incorporated in a radio receiving circuit.

In the circuit illustrated, the arrangement of the different elements corresponds, in general, to known circuits which employ audions as simultaneous amplifiers of radio and audio frequency oscillations. The circuit includes a suitable tuned receiving circuit 1, an amplifying audion 2, a vario-transformer 3 such as described in my prior Patent No. 1,514,416, granted Nov. 4, 1924, a grid condenser and leak 4, and a detector audion 5. The plate of the detector is connected to the primary side of an audio frequency transformer 6 and the secondary of the transformer 6 is connected through the tuned circuit 1 to the grid of the amplifying audion 2. The connection between the low side of the secondary winding of the transformer 6 and the amplifying audion filament includes a C battery 7 having appropriate means including a potentiometer 7′ for varying the biasing voltage impressed upon the grid of the audion. The telephones 8, preferably shunted by a fixed condenser 9, are connected between the B battery 10 of the amplifier audion and the negative side of the A battery 11. The plate circuit of the detector includes the usual B battery 12 between the audio frequency transformer and the detector filament. Condensers 13, 14 across the audio transformer primary and B battery 12 and across the audio transformer secondary, respectively, provide means for by-passing radio frequency oscillations around the transformer 6. It will be observed that the circuits established provide for the simultaneous amplification of radio and audio frequency oscillations in the audion 2, but this feature is not essential to my invention, as the telephones may be included in the plate circuit of the detector. The arrangement as illustrated is preferable, however, since it permits the use of an audio transformer of the usual construction, and the full audio frequency drop in the plate circuit occurs across the transformer.

In operation, the voltage of the C battery is adjusted to bias the amplifying audion to bring the operating point upon a curved portion of the plate current-grid voltage characteristic. When a modulated radio frequency wave is received, the current is amplified by the audion 2, passed through the vario-transformer 3 to the detector 5, where it is rectified. The resulting audio currents pass into the audio-transformer 6 and causes a second audio frequency bias voltage to be impressed upon the amplifying audion 2 in phase with, or exactly opposite in phase to, the modulated radio frequency voltage which this audion is passing through to the detector. Since the detector operates according to the square law, i. e., the detected audio frequency is proportional, roughly, to the square of the amplitude of the envelop of the radio frequency wave, the peaks in this envelop are unduly extended in the audio wave, producing an alteration in the quality of the audio tone. Due to the fact that the constant bias from the C battery has brought the operating point to a curved portion of the aforementioned characteristic, the audio bias produces a variation in the amplifying ratio which causes the audion 2 to pass a modulated radio frequency wave in which the peaks are flattened. This flattening of the peaks of the envelop of the radio frequency wave produces an envelop having such variations from the original wave shape as to reduce or eliminate the distortion produced by the detector.

It will be obvious that the invention is not limited to a radio receiving circuit of the type shown since a correcting bias voltage of substantially the same wave form as an audio frequency wave or the modulated envelop of a radio frequency wave may be applied to an audion of other amplifying circuits for the purpose of reducing or eliminating the distortion normally present in such a circuit. The correcting bias may be introduced in telephone repeating circuits, in radiophone transmitting circuits, or in audio frequency amplifying circuits, and the bias may be impressed upon one or more of the audions of the circuit. In radio telephone reception, the invention is not limited to circuits employing an audion detector, but is useful with any detector which produces a distorted audio wave, i. e., one which does not have the same form as the envelop of the radio frequency wave.

I claim:

1. In an electrical communication circuit, an element producing a distortion in the shape of the wave traversing said circuit, an amplifying audion preceding said element, and means coupling the element and amplifying audion for varying the amplifying ratio of said audion to introduce a correction neutralizing the distortion introduced by said element.

2. In a radio receiver comprising a cascaded radio frequency amplifier of the audion type and a detector of the type producing inherent distortion, circuit connections between said audion and detector for impressing upon the input circuit of said amplifier audion audio frequency response energy of said detector, and means impressing a negative bias potential upon said audion of a magnitude sufficient to bring the operating point of said audion to a curved portion of its plate current-grid voltage characteristic.

3. Method of operating an electrical circuit including a vacuum tube amplifier and a detector to neutralize distortion inherent in the detector which comprises adjusting said amplifier to operate upon a curved portion of its plate current-grid voltage characteristic curve, detecting the amplified currents by the detector having the inherent distortion and employing said detected currents to control the amplifying ratio of said amplifier in such a manner as to produce therein a neutralizing distortion.

4. Method of operating an electrical circuit including a vacuum tube amplifier and a detector to neutralize distortion inherent in the detector which comprises biasing said amplifier to operate upon a curved portion of its plate current-grid voltage characteristic, impressing alternating currents upon said amplifier input, detecting the amplified currents by said detector having inherent distortion, and employing said detected currents to vary the bias of said amplifier in such a manner as to produce a neutralizing distortion.

5. Method of operating a vacuum tube detector to neutralize inherent distortion thereof, which comprises impressing currents upon said detector, detecting said impressed currents, and employing said detected currents to produce a neutralizing distortion in said impressed currents.

6. In the reproduction of signals by means including a transmission element having the inherent property of distorting the form of an electrical wave, the method of preventing distortion in the reproduction of the electrical wave which comprises impressing a signal of the electrical wave type upon an amplifier, varying the amplification of the amplifier to introduce distortion of a sense opposite to that of the inherent distortion of said transmission element, impressing upon said element the distorted signal-wave produced by said amplifier, and impressing upon a reproducer the signal wave of corrected form that is produced by said transmission element.

7. The method of automatically controlling the output of an electrical communication system of the type including an audion amplifier effective to amplify a received signal of the modulated carrier wave type and a detector for demodulating the amplified signal energy to produce an audio frequency current, which method comprises impressing upon the grid of said audion amplifier a direct current bias of such magnitude that said amplifier operates upon a curved portion of its plate current-grid voltage characteristic curve, and superposing upon said applied direct current bias a second potential developed by said detector and varying in magnitude with rectified signal energy, thereby automatically to vary the amplification of said audion amplifier in accordance with the magnitude of received signal energy.

8. The method of automatically controlling the output of a radio receiver of the type including a radio frequency amplifier and a detector, which comprises impressing the received signal energy upon the radio frequency amplifier, impressing upon an input electrode of said audion amplifier a direct current potential of such magnitude that said amplifier operates upon a curved portion of its plate current-grid voltage characteristic, passing the amplified energy to said detector, and transferring to said amplifier electrode as an amplification-controlling bias a potential derived from said detector and varying in magnitude with rectified signal energy developed by said detector.

9. The invention as set forth in claim 8 wherein said direct current potential and amplification-controlling potential are impressed upon the control grid of said amplifier audion.

10. In an electrical communication system, the combination with a high frequency amplifier of side band modulated carrier energy and means impressing upon an amplification-control circuit of said amplifier a direct current potential appropriate for the normal amplification of relatively weak carrier energy, of means effective automaticaly to reduce the amplification of said amplifier as the carrier strength increases, said second means comprising a rectifier, means transmitting to said rectifier the modulated carrier output of said amplifier, and circuit elements for superposing upon said direct current potential a second potential derived from said rectifier and varying in magnitude with the rectified modulated carrier energy.

11. In a radio broadcast receiver, a radio frequency amplifier provided with a tuned input circuit adapted to have carrier and signal modulation side band energy impressed thereon, a rectifier having its input circuit coupled to the amplifier output circuit whereby the amplified carrier and modulation side band energy is impressed on the rectifier, means for normally maintaining the control electrode of said amplifier at a negative potential with respect to the cathode, and means for applying, between said amplifier control electrode and cathode, a voltage derived from the rectifier output circuit in a sense to oppose variations in the signal energy in the rectifier output circuit, which last named variations are produced by variations in intensity of the signal energy impressed on said amplifier tuned input circuit.

12. In a radio broadcast receiver, a radio frequency amplifier provided with a tuned input circuit adapted to have carrier and signal modulation side band energy impressed thereon, a detector having its input circuit coupled to the amplifier output circuit whereby the amplified carrier and modulation side band energy is impressed on the detector, means in the cathode circuit of said amplifier for normally maintaining the control electrode of said amplifier at a negative potential with respect to the cathode, and means for applying, between said amplifier control electrode and cathode, a voltage derived from the detector output circuit in a sense to oppose variations in the signal energy in the detector output circuit, which last named variations are produced by variations in intensity of the signal energy impressed on said amplifier tuned input circuit.

In testimony whereof I affix my signature.

STUART BALLANTINE.